United States Patent [19]

Souloumiac

[11] Patent Number: 4,884,073
[45] Date of Patent: Nov. 28, 1989

[54] INCREASED SENSITIVITY OPTICAL KEYBOARD

[76] Inventor: Alain Souloumiac, 29, rue du General Brunet, F-75019 Paris, France

[21] Appl. No.: 143,162

[22] Filed: Dec. 23, 1987

[30] Foreign Application Priority Data

Apr. 25, 1986 [FR] France .................................. 86 06067

[51] Int. Cl.$^4$ .......................................... H03M 11/00
[52] U.S. Cl. ........................................ 341/31; 341/26; 250/221
[58] Field of Search .................................. 341/26, 31; 340/711–713, 825.79, 825.82, 870.28, 870.29; 250/221, 229, 222.1; 400/479, 480; 178/17 C

[56] References Cited

U.S. PATENT DOCUMENTS 4,652,741 3/1987 Golborne .......................... 250/221
4,672,195 6/1987 Golborne et al. .................. 250/221

Primary Examiner—Donald J. Yusko
Assistant Examiner—Tyrone Queen
Attorney, Agent, or Firm—Steele, Gould & Fried

[57] ABSTRACT

A matrix-scanning optical keyboard comprising a logical matrix of optical paths between light inlets (3) and outlets (2) with keys disposed on each optical path connecting an inlet to an outlet in such a manner that depressing a key causes a change which can be detected by a scanning driver circuit connected to the light inlets and outlets in order to respond to changes affecting each inlet-to-outlet (3-to-2) coupling by periodically injecting an interrogation signal into each inlet in turn and by inspecting each outlet for the presence of possible changes. The keyboard is capable, for a given emission level, of increasing the sensitivity of the driver circuit to light arriving at the outlets.

10 Claims, 3 Drawing Sheets

INCREASED SENSITIVITY OPTICAL KEYBOARD

Applicant claims the benefit under 35 U.S.C. 120 and 365(c) of the filing date of PCT Application No. PCT/FR87/00141.

Applicant claims benefit under 35 U.S.C. 120 and 365(c) of the filing date of international application PCT/FR87/00141 filed 27 Apr. 1987.

The present invention relates to the electronics of matrix-scanning optical keyboards used as input terminals, office machines, or musical instruments, for example.

The keys of matrix-scanning optical keyboards are disposed in a logical matrix of optical paths running from light inlets and to light outlets, with each key acting on a particular optical path going from a light inlet to a light outlet. The action of a key changes the state of inlet-to-outlet coupling on the path specific thereto, and the scanning drive circuit connected to said inlets and outlets detects the resulting change. This inspection takes place by injecting an interrogation signal into each series of light inlets one after the other, and in observing the state of all of the outlets in order to detect whether any of them has been affected by the key associated therewith.

It is important to inspect all of the keys sufficiently frequently in order to be sure that when a user presses on one of them there is no danger of this fact passing unnoticed by the scanning driver circuit. When an action is detected, the scanning driver circuit must perform two functions: it must continue to inspect the keyboard while also following a sequence of operations specific to the actuated key and reporting on the stages of this sequence of operations to the equipment which is making use of the keyboard.

This speed depends on several factors, in particular on the power and the rapidity of the light sources, and above all on the sensitivity and the remanence of the detection means. Preferred embodiments of the present invention seek to define means for increasing the effectiveness and the reliability of the driver circuit by increasing the sensitivity of the detection means.

The present invention provides a matrix-scanning optical keyboard comprising a logical matrix of optical paths running from light inlets to light outlets, with keys being disposed on each optical path connecting an inlet to an outlet such that depressing a key causes a change which can be detected by a scanning driver circuit connected to said light inlets and outlets in order to detect such changes in any inlet-to-outlet coupling by peridically injecting an interrogation signal into each inlet in turn and by inspecting the possible presence of signal modification at each outlet, said scanning driver circuit being characterized by the fact that it includes means capable, for a given level of emission, of increasing its sensitivity to light arriving at said outlets.

A first way of increasing the sensitivity of said driver circuit is to increase the time that each of the photodetectors is inspected. However, this first way suffers from the drawback of slowing down the speed at which the keyboard is inspected. That is why the present invention seeks to reduce the drawback inherent to said first way by varying the rate at which the keyboard is scanned as a function of the detection sensitivity either of each component or else of the slowest component.

This variable inspection rate is made possible in optical keyboards because of their characteristic lack of bounce. As a result there is no need for anti-bounce routines which operate at a fixed rate which is a function of the expected bounce time. Since this real time constraint does not exist in optical keyboards, the difficulties involved in varying the scanning rate are reduced or eliminated.

In an optical keyboard, the light outlets leading to the opto-electronic transducers connected to the scanning driver circuit may be subjected at the beginning of the scanning cycle to a pre-signal which is applied to all of said transducers for the purposes of: verifying that all of the transducers are indeed responding; determining the time taken by the first one of them to respond, and the time taken by the last one of them to drop below a predetermined threshold; thereby verifying that said transducers are operating properly; and establishing the shortest time interval which can be allocated between the successive interrogation signals which are sent.

Another way of saving time, and thus increasing the time available for inspection operations and for increasing the sensitivity of the receivers, is to lose as little time as possible in the operations of identification, encoding and message transmission from the keyboard. This can be done by adopting a preferential positioning for "combining" keys (such as the capital shift or the control shift key) within the scanning matrix. Since the purpose of such "combining" keys is to be combined with other keys, it is desirable to ensure that these keys are preferably located in the first light source scan sequence.

Embodiments of this optical keyboard are described, by way of example, with reference to the accompanying drawings, in which.

Figure 1:
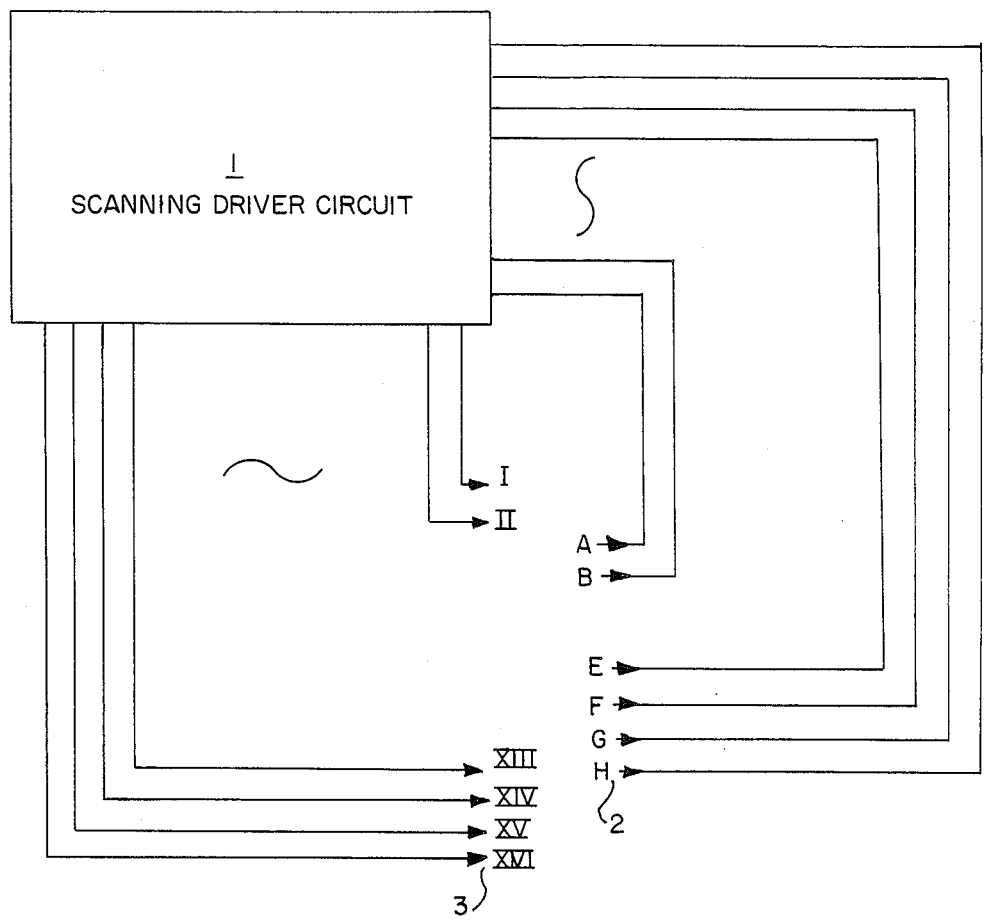
FIG. 1 is a theoretical diagram for explaining how the scanning driver circuit operates.

FIG. 1 is a theoretical diagram for explaining the operation of a scanning driver circuit 1. At time T1, it switches on a light source 3 (I) and light from the source is directed towards a plurality of photodetectors 2 (ABC, . . . , GH). Each of the detectors receives light energy and informs the driver circuit by applying a current thereto which exceeds a given excitation threshold. The result of this inspection is processed by the driver circuit. Then at time T2, the next light source in the sequence (which is referenced (II) in this case) is put into operation, and so on, until the last light source (XVI) has been used, thus marking the end of an inspection cycle for the entire keyboard.

The amount of energy received by each photodetector may vary by a considerable amount, and the time taken to generate data may also vary depending both on the components used and on the energy received. One method of avoiding these constraints consists in providing safety margins such as doubling or tripling the emission time required for obtaining a signal on a component of mediocre quality. While not absolutely safe, this method provides a fairly serious guarantee that no signal will be ignored, even under worst-case conditions.

However, this solution suffers from the drawback of being, by definition, both slow and energy hungry.

One of the preferred solutions in the present embodiment consists in defining the beginning of each scan cycle for a light source as the moment at which the slowest of the photodetectors is ready for receiving new information in reliable manner. This instant is determined by measuring the residual voltages at the terminals of the photodetectors in comparison with a de-excitation threshold.

A pre-signal 9 (see FIGS. 2 and 3) may be used to perform this measurement by analyzing the reactions of the photodetectors 2, thereby verifying that the keyboard is operating properly. This light pre-signal is applied to all of the photodetectors until every one of them has exceeded a predetermined excitation threshold. Once this threshold has been reached, a check is performed to see that all of the photodetectors do indeed return to the de-excitation threshold. If the operation of one of more photodetectors is observed to be faulty during either of these measurements, an error message may be sent to the system to which the keyboard is connected.

Figure 2:
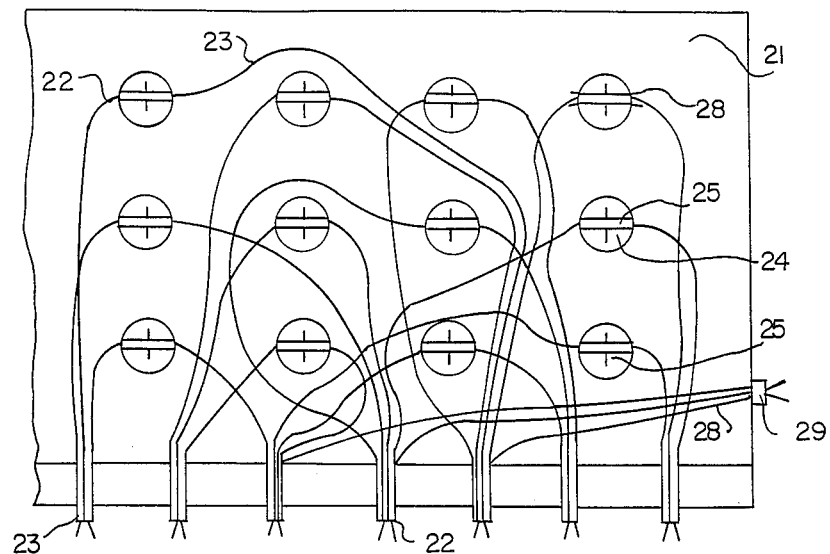
FIG. 2 shows a first type of optical keyboard which is subjected to a pre-signal.
Figure 3:
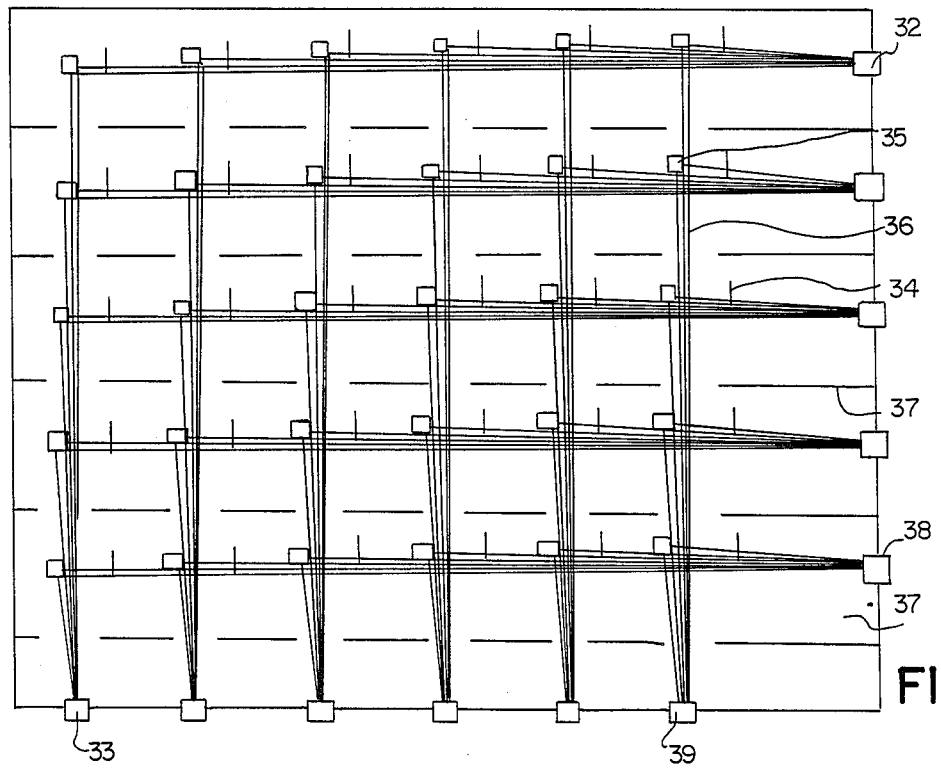
FIG. 3 shows a second type of optical keyboard which is subjected to a pre-signal.

An example of a verification pre-signal is shown in FIG. 2. This figure relates to an optical keyboard having pairs of optical fibers 23, 22 passing therethrough, with one fiber in each pair bringing light in and with the other taking a signal out. These pairs of fibers meet at respective key-operated switches.

In this case, the pre-signal is provided by means of special fibers. Unlike the ordinary fibers, the special fibers 28 which enable a light source to emit a signal to the receiving transducers are un-cut. When the light source 29 applies a pre-signal, all of the receivers are thus directly eliminated regardless of the state of the keys. It is thus possible to measure the reaction time of the various receivers, to determine which is the first receiver to be activated and which is the last receiver to be deactivated, and simultaneously to increase the sensitivity of the receivers prior to applying detection signals to the light sources 23.

Another embodiment (FIG. 3) relates to a keyboard having fixed mirrors. The keyboard comprises a hollow box 31 enclosed by a plurality of edges. In the example shown in FIG. 3, the optical block is rectangular. Two adjacent edges have light emitter components 33 and detector components 32. In order to increase the power and the sensitivity of the assembly, distances may be reduced by placing emitter or detector components on the third and even on the fourth side of the housing, which is equivalent to installing a plurality of matrices within a single optical block. The emitted energy may also be better exploited by installing two rows of mirrors (not shown) at a given angle facing each light source.

The reflectors are located inside the block at points close to the intersections 35 between emission rows and detection columns. The light is reflected between columns 33 and rows 32 by means of small reflectors 35 which are located in such a manner as to avoid mutual interference. When a key 11 is depressed, it causes a shutter to mask or unmask one of the reflectors.

In this embodiment, a pre-signaling light source 39 may be provided and it may be given a pre-signaling optical path which cannot be interrupted by any of the keys. A similar verification outlet 38 (FIG. 3) may be provided to ensure that the light sources are functioning properly by adding a special photodetector which can then observe proper operation of each light source whenever it is switched on.

Figure 4:
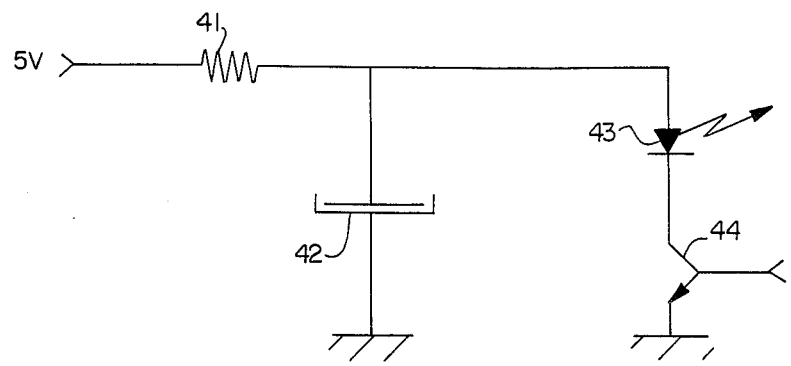
FIG. 4 shows a capacitor powering the light-emitting transducers.
Figure 5:
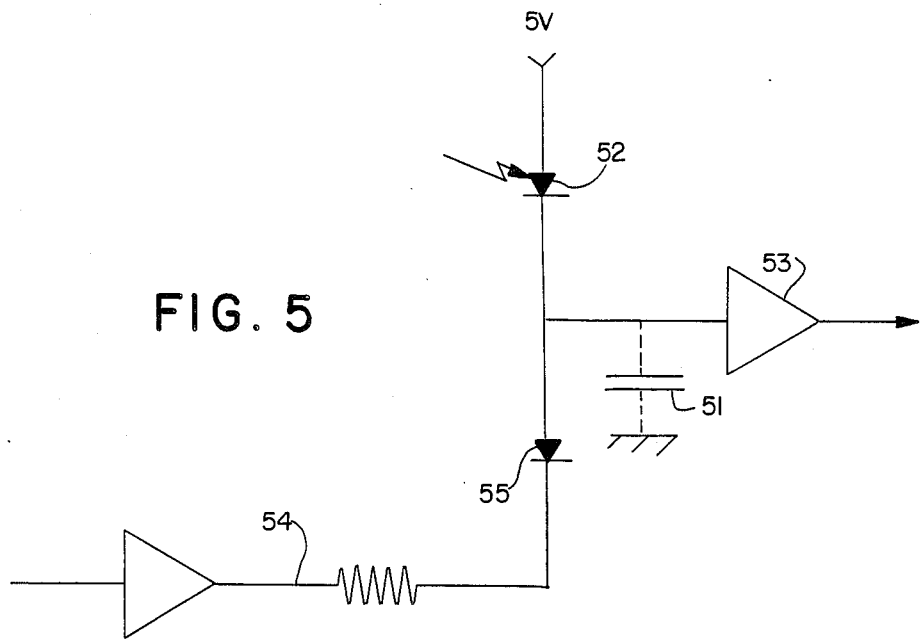
FIG. 5 shows a single circuit for detecting a light pulse with information being stored on its stray input capacitance.

FIGS. 4 and 5 show other ways of reducing time and improving signal reliability by increasing the power of the light sources and the sensitivity of the detectors. FIG. 4 shows an embodiment enabling the power emitted from a light source 43 to be very considerably increased by virtue of a reservoir capacitor 42 which serves as an instantaneous high-power source. A current-limiting resistor 41 is provided in the circuit in order to recharge the reservoir capacitor prior to the next pulse. A transistor type switch 44 triggers discharge of the reservoir capacitor through the light source 43, which in this case is a light emitting diode (LED) whenever a control pulse is applied to its base.

FIG. 5 shows an embodiment for increasing the sensitivity of the photodetectors by means of a circuit 54 for resetting the stray input capacitance 51 which is discharged to a reference voltage such as 0 volts via a switching device such as a diode or a CMOS relay 54 under the control of a reset signal. The reset circuit 54 then returns to an operating voltage, e.g. 5 volts, and the diode 55 is blocked. If the photodiode 52 does not receive any light, the stray capacitance 51 remains at 0 volts. When it does receive a light pulse, the capacitance 51 charges to 5 volts and remains charged until the next recess signal. The output from the MOS amplifier 53 reproduces the voltage on the capacitance 51.

Other means may be implemented to increase photodetector sensitivity, in particular when detector transistors are used. Whereas most of the electronics is powered at a supply voltage of about 5 volts, it is preferable to power light receiving transducers with a voltage that is several times greater in order to increase their sensitivity.

I claim:

1. A matrix-scanning optical keyboard comprising a logical matrix of optical paths between light inlets and light outlets, with keys being disposed on each optical path connecting an inlet to an outlet in such a manner that depressing a key causes a change which is detectable by a scanning driver circuit connected to said light inlets and outlets in order to register such changes affecting each inlet-to-outlet coupling by cyclically injecting an interrogation signal into each inlet in turn and by inspecting each outlet for the presence of possible modifications thereat opto-electronic transducers connected to the scanning driver circuit and photodetectors at the outlets, said keyboard being characterized by the fact that it includes means which are capable for a given emission level of increasing the sensitivity of said scanning driver circuit to light arriving at said outlets.

2. An optical keyboard according to claim 1, characterized by the fact that said means capable of increasing the scanning driver circuit's light sensitivity are constituted by means of an increase in the scanning duration available as optimized by a variable scanning rate capable of rising to speeds which are sufficient to permit the scanning driver circuit to detect a degradation in photodetector response.

3. An optical keyboard according to claim 1 characterized in that, when no keys are depressed, each scanning cycle of a light source begins at the moment when the slowest of the photodetectors is ready to receive new information.

4. An optical keyboard according to claim 1 characterized in that said outlets leading to the opto-electronic tranducers connected to the scanning driver circuit may be subjected to a pre-signal delivered to all of said opto-electronic transducers.

5. An optical keyboard according to claim 1 characterized in that it includes an additional pre-signal injection inlet which is connected to each of said light outlets via permanent optical paths which cannot be interrupted by the keys.

6. An optical keyboard according to claim 1 characterized in that an additional outlet is connected to said inlets.

7. An optical keyboard according to claim 1 characterized in that specific ones of the keys are associated with optical paths such that their state is examined at the beginning of keyboard scanning.

8. An optical keyboard according to claim 1 wherein the opto-electronic transducers have a reference voltage and wherein said means for increasing the light sensitivity of the scanning driver circuit consists in feeding the transducers with a voltage which is several times greater than their reference voltage.

9. An optical keyboard according to claim 2 characterized in that said outlets leading to the opto-electronic transducers connected to the scanning driver circuit may be subjected to a pre-signal delivered to all of said opto-electronic transducers.

10. An optical keyboard according to claim 3 characterized in that said outlets leading to the opto-electronic transducers connected to the scanning driver circuit may be subjected to a pre-signal delivered to all of said opto-electronic transducers.

* * * * *